United States Patent [19]

Pham

[11] Patent Number: 5,432,466
[45] Date of Patent: Jul. 11, 1995

[54] ECL TO TTL TRANSLATOR WITH POWER SUPPLY NOISE SUPPRESSION

[75] Inventor: Phuc Pham, Chandler, Ariz.

[73] Assignee: Motorola, Inc., Schaumburg, Ill.

[21] Appl. No.: 220,480

[22] Filed: Mar. 31, 1994

[51] Int. Cl.⁶ ......................................... H03K 19/018
[52] U.S. Cl. ...................................... 326/78; 326/126
[58] Field of Search ............... 307/475, 455, 443, 494; 326/78, 126

[56] References Cited

U.S. PATENT DOCUMENTS

| | | | |
|---|---|---|---|
| 4,401,901 | 8/1983 | Ochi | 307/475 |
| 4,647,799 | 3/1987 | Hsu et al. | 307/455 |
| 4,877,977 | 10/1989 | Kokado | 307/443 |
| 4,939,393 | 7/1990 | Petty | 307/443 |
| 5,013,941 | 5/1991 | Jansson | 307/455 |
| 5,025,179 | 6/1991 | Freitas | 307/455 |

*Primary Examiner*—David R. Hudspeth
*Assistant Examiner*—Benjamin D. Driscoll

*Attorney, Agent, or Firm*—Gary W. Hoshizaki

[57] ABSTRACT

A translator circuit (21) converts an ECL logic level to a TTL logic level. The translator circuit (21) operates at high speeds, rejects power supply noise, and does not use Schottky diodes for preventing transistors from saturating. The translator circuit comprises a differential input stage (22), a level shift stage (23), a differential stage (24), and an output stage (25). The differential input stage (22) is responsive to an ECL signal and provides a differential output signal. The level shift stage (23) level shifts the differential output signal of the differential input stage a predetermined DC voltage. The differential stage (24) is responsive to the level shift stage (23) and generates first and second output signals. The differential stage (24) rejects power supply noise coupled from the level shift stage (23). The output stage (25) is responsive to the first and second output signals of the differential stage (24) and converts the first and second signals to a single ended TTL signal corresponding to the logic level of the ECL signal.

15 Claims, 1 Drawing Sheet

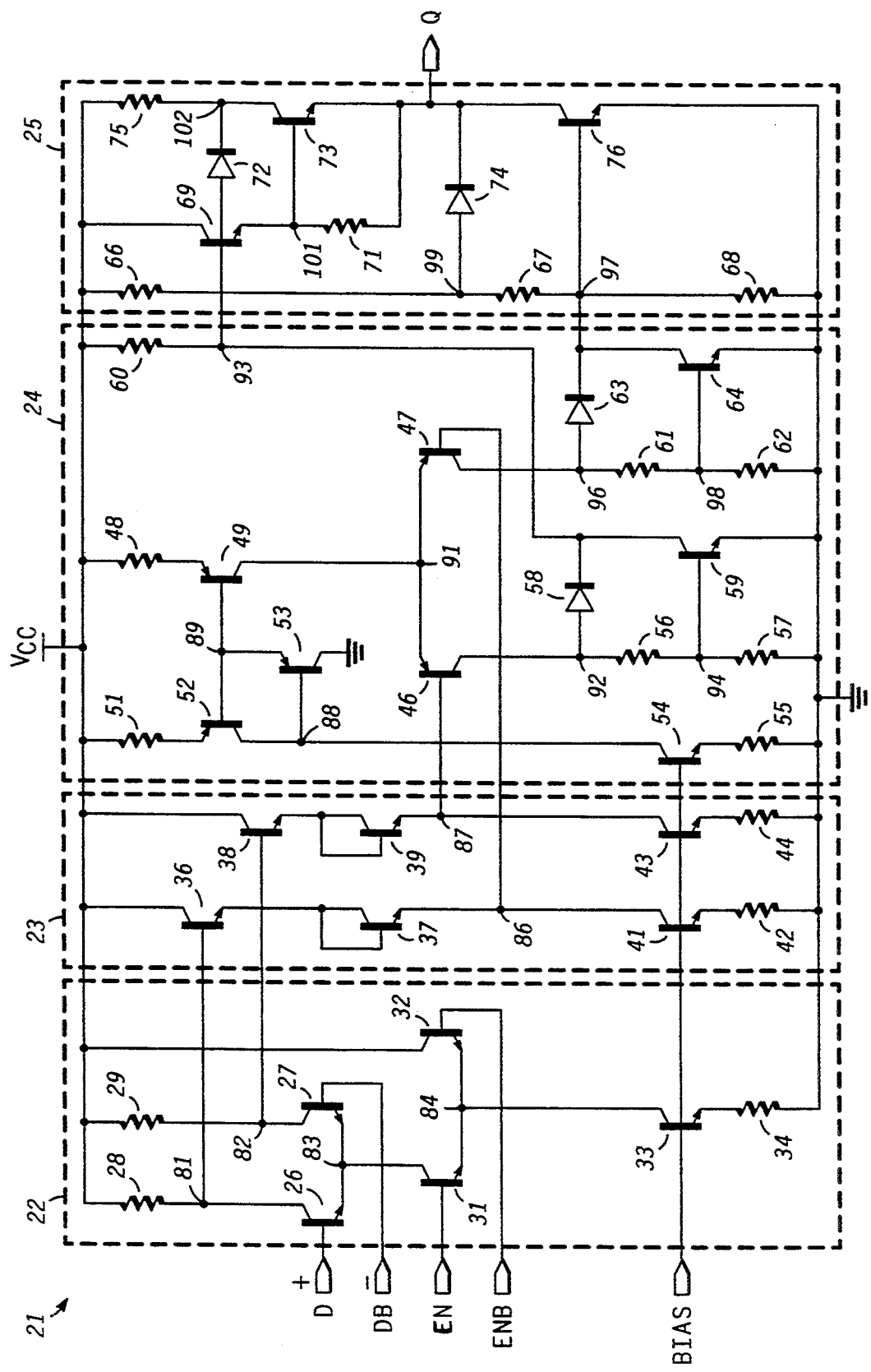

ECL TO TTL TRANSLATOR WITH POWER SUPPLY NOISE SUPPRESSION

Background of the Invention

This invention relates, in general, to translator circuits, and more particularly, to Emitter Coupled Logic (ECL) to Transistor Transistor Logic (TTL) translator circuits.

In general, there are many different formats for sending digital information. Each format has different voltage levels corresponding to a logic one level and a logic zero level. Three different formats are widely used, they are a CMOS (Complementary Metal Oxide Semiconductor) format, TTL format, and ECL format. The process technology used by the different formats plays a key role in determining the logic levels.

In the past, CMOS, TTL, and ECL formats were not commonly used with each other due to the differences in performance and circuit type. The proliferation of integrated circuits in an increasing array of products makes it almost impossible for complex systems not to interface between different digital formats. Thus there is a significant need for high performance translator circuits. Also, the vast performance differential between the digital formats has been tempered somewhat by the advances in wafer processing. Furthermore, the merging of both bipolar and CMOS on a single process (BICMOS) allows the integration of each digital format on a single semiconductor die.

One type of translator commonly used is an ECL to TTL translator. The ECL to TTL translator converts ECL digital logic levels to TTL digital logic levels. An ECL to TTL translator circuit must be extremely fast due to the high data rates common to ECL circuitry. Also, an ECL to TTL translator operates over the power supply range of a TTL circuit. Typically, an ECL to TTL translator circuit comprises an input differential stage for receiving ECL signals, a level shift stage, and a differential to single ended converter stage for generating TTL logic levels. A problem occurs due to the wide variation (4.5 volts-5.5 volts) in power supply voltage allowed for TTL circuits. A typical level shift stage of an ECL to TTL translator circuit is prone to power supply variations that can affect circuit performance. The poor power supply rejection of the level shift stage sometimes couples to the output stage which affects the translation of an ECL signal.

Furthermore, an ECL to TTL translator is commonly fabricated on a high speed bipolar process to maximize the speed of the translator. Transistors which form a translator circuit are not allowed to saturate unless a significant reduction in translation speed is acceptable. Typically, ECL to TTL translators use Schottky diodes to prevent transistors from saturating. This presents a problem for translator designs in high speed bipolar processes that do not have Schottky diodes. It would be of great benefit if an ECL to TTL translator circuit could be provided that has increased power supply rejection, operates at high speeds, and does not require Schottky diodes.

BRIEF DESCRIPTION OF THE DRAWINGS

A sole FIGURE illustrates an ECL to TTL translator circuit in accordance with the present invention.

DETAILED DESCRIPTION OF THE DRAWINGS

The sole FIG. is a schematic diagram of an ECL to TTL translator circuit 21 in accordance with the present invention. Translator circuit 21 has a D input (data input), a DB input (databar input), an EN input (enable input), an ENB input (enablebar input), a BIAS input, and a Q output. Translator circuit 21 comprises a differential input stage 22, a level shift stage 23, a differential stage 24, and an output stage 25. An ECL input signal is applied across the D and DB inputs of translator circuit 21 and a TTL output signal having a logic level corresponding to the ECL input signal is provided at the Q output.

Differential input stage 22 has a first input coupled to the D input, a second input coupled to the DB input, a third input coupled to the EN input, a fourth input coupled to the ENB input, a bias input coupled to the BIAS input, a first output, and a second output. In the preferred embodiment, differential input stage 22 comprises transistors 26, 27, 31, 32, and 33, and resistors 28, 29, and 34. Transistors 26, 27, 31, 32, and 33 are NPN bipolar transistors each having a collector, base, and emitter corresponding respectively to a first electrode, a control electrode, and a second electrode.

Transistor 33 and resistor 34 form a current source for biasing differential input stage 22. Resistor 34 has a first terminal coupled for receiving a first supply voltage (e.g. ground) and a second terminal. Transistor 33 has the collector coupled to a node 84, a base coupled to the bias input of differential input stage 22, and an emitter coupled to the second terminal of resistor 34.

Transistors 31 and 32 form a differential input pair for enabling and disabling differential input stage 22. Transistor 31 has the collector coupled to a node 83, the base coupled to the third input of differential input stage 22, and the emitter coupled to node 84. Transistor 32 has the collector coupled for receiving a second supply voltage (e.g. VCC), a base coupled to the fourth input of differential input stage 22, and an emitter coupled to node 84.

Transistors 26 and 27 form a differential input pair for driving resistors 28 and 29 respectively. Transistor 26 has the collector coupled to a node 81, the base coupled to the first input of differential input stage 22, and the emitter coupled to node 83. Transistor 27 has the collector coupled to a node 82, the base coupled to the second input of the differential input stage 22, and the emitter coupled to node 83. Resistors 28 and 29 act as resistive loads for transistors 26 and 27. Resistor 28 has a first terminal coupled to node 81 and a second terminal coupled for receiving the second supply voltage. Resistor 29 has a first terminal coupled to node 82 and a second terminal coupled for receiving the second supply voltage. Nodes 81 and 82 correspond to the first output and second output respectively of differential input stage 22.

Level shift stage 23 has a first input coupled to node 81, a second input coupled to node 82, a bias input coupled to the BIAS input of translator circuit 21, a first output, and a second output. Level shift stage 23 comprises transistors 36-39, 41, and 43, and resistors 42 and 44. Transistors 36-39, 41, and 43 are NPN bipolar transistors each having a collector, base, and emitter corresponding respectively to a first electrode, a control electrode, and a second electrode.

Transistors 36 and 37 level shift a signal provided at the first output of differential input stage 22. Transistor 36 has the collector coupled for receiving the second supply voltage and the base coupled to the first input of level shift stage 23. Transistor 37 has the collector and the base coupled in common to the emitter of transistor 36 and the emitter coupled to a node 86. Transistor 41 and resistor 42 form a bias circuit for biasing transistors 36 and 37. Transistor 41 has the collector coupled to node 86 and the base coupled to the bias input of level shift stage 23. Resistor 42 has a first terminal coupled to the emitter of transistor 41 and a second terminal coupled for receiving the first supply voltage.

Transistors 38 and 39 level shift a signal provided at the second output of differential input stage 22. Transistor 38 has the collector coupled for receiving the second supply voltage and the base coupled to the second input of level shift stage 23. Transistor 39 has the collector and the base coupled in common to the emitter of transistor 38 and the emitter coupled to a node 87. Transistor 43 and resistor 44 form a bias circuit for transistors 38 and 39. Transistor 43 has the collector coupled to node 87 and the base coupled to the bias input of level shift stage 23. Resistor 44 has a first terminal coupled to the emitter of transistor 43 and a second terminal coupled for receiving the first supply voltage. Nodes 86 and 87 correspond respectively to the first output and the second output of level shift stage 23.

Differential stage 24 receives level shifted signals from level shift stage 23 and provides output signals for driving output stage 25. Differential stage 24 has a first input coupled to node 86, a second input coupled to node 87, a bias input coupled to the BIAS input of translator circuit 21, a first output, and a second output. Differential stage 24 comprises transistors 46, 47, 49, 52, 53, 54, 59, and 64, diodes 58 and 63, and resistors 48, 51, 55, 56, 57, 60, 61 and 62. Transistors 46, 47, 49, 52, and 53 are PNP transistors each having a collector, a base, and emitter corresponding respectively to a first electrode, a control electrode, and a second electrode. Transistors 54, 59, and 64 are NPN transistors each having a collector, a base, and an emitter corresponding respectively to a first electrode, a control electrode, and a second electrode.

A bias stage for biasing differential stage 24 comprises transistors 49, 52, 53, and 54 and resistors 48, 51, and 55. Transistor 54 has the collector coupled to a node 88 and the base coupled to the bias input of differential stage 24. Resistor 55 has a first terminal coupled to the emitter of transistor 54 and a second terminal coupled for receiving the first supply voltage. Transistor 52 has the collector coupled to node 88 and the base coupled to a node 89. Resistor 51 has a first terminal coupled to the emitter of transistor 52 and a second terminal coupled for receiving the second supply voltage. Transistor 53 has the collector coupled for receiving the first supply voltage, the base coupled to node 88, and the emitter coupled to node 89. Transistor 49 has the collector coupled to a node 91 and the base coupled to node 89. Resistor 48 has a first terminal coupled to the emitter of transistor 49 and a second terminal coupled for receiving the second supply voltage.

A differential input pair is formed by transistors 46 and 47. Transistor 47 has the collector coupled to a node 96, the base coupled to the first input of differential stage 24, and the emitter coupled to node 91. Transistor 46 has the collector to a node 92, the base coupled to the second input of differential stage 24, and the emitter coupled to node 91.

A first non-saturated output drive stage of differential stage 24 comprises transistor 64, diode 63, and resistors 61 and 62. Resistor 61 has a first terminal coupled to node 96 and second terminal coupled to a node 98. Resistor 62 has a first terminal coupled to node 98 and a second terminal coupled for receiving the first supply voltage. Transistor 64 has the collector coupled to a node 97, the base coupled to node 98, and the emitter coupled for receiving the first supply voltage. Diode 63 has an anode coupled to node 96 and a cathode coupled to node 97.

A second non-saturating output drive stage of differential stage 24 comprises transistor 59, diode 58, and resistors 56, 57, and 60. Resistor 56 has a first terminal coupled to node 92 and a second terminal coupled to a node 94. Resistor 57 has a first terminal coupled to node 94 and a second terminal coupled for receiving the first supply voltage. Transistor 59 has the collector coupled to a node 93, the base coupled to node 94, and the emitter coupled for receiving the first supply voltage. Diode 58 has an anode coupled to node 92 and a cathode coupled to node 93. Resistor 60 has a first terminal coupled for receiving the second supply voltage and a second terminal coupled to node 93. Nodes 97 and 93 correspond respectively to the first output and the second output of differential stage 24.

Output stage 25 converts signals provided at the first and second outputs of differential stage 24 to a single ended signal having TTL logic levels. Output stage 25 comprises transistors 69, 73, and 76 diodes 72 and 74, and resistors 66–68, 71, and 75. Transistors 69, 73, and 76 are NPN bipolar transistors each having a collector, a base, and an emitter corresponding respectively to a first electrode, control electrode, and second electrode. Output stage 25 has a first input coupled to node 97, a second input coupled to node 93, and an output coupled to the Q output of translator circuit 21.

A non-saturating pull down stage of output stage 25 comprises transistor 76, diode 74, and resistors 66–68. Resistor 66 has a first terminal coupled for receiving the second supply voltage and a second terminal coupled to a node 99. Resistor 67 has a first terminal coupled to node 99 and a second terminal coupled to the first input of output stage 25. Resistor 68 has a first terminal coupled to the first input of output stage 25 and a second terminal coupled for receiving the first supply voltage. Transistor 76 has the collector coupled to the output of output stage 25, the base coupled to the first input of output stage 25, and the emitter coupled for receiving the first supply voltage. Diode 74 has an anode coupled to node 99 and a cathode coupled to the output of output stage 25.

A pull up stage of output stage 25 comprises transistors 69 and 73, diode 72, and resistors 71 and 75. Transistor 69 has the collector coupled for receiving the second supply voltage, the base coupled to the second input of output stage 25, and the emitter coupled to a node 101. Transistor 73 has the collector coupled to a node 102, the base coupled to node 101, and the emitter coupled to the output of output stage 25. Resistor 75 has a first terminal coupled for receiving the second supply voltage and a second terminal coupled to node 102. Resistor 71 has a first terminal coupled to node 101 and a second terminal coupled to the output of output stage 25. Diode 72 has an anode coupled to the second input of output stage 25 and a cathode coupled to node 102.

Operation of translator circuit 21 is described hereinafter. A bias voltage is applied to the bias input of translator circuit 21 for generating bias currents in differential input stage 22, level shift stage 23, and differential stage 24. A positive differential voltage applied across the EN and ENB inputs respectively of translator circuit 21 enables translator circuit for translating an ECL signal to an TTL signal. The positive voltage steers current provided by transistor 33 through transistor 31 thereby biasing transistors 26 and 27 of differential input stage 22.

A negative differential voltage applied across the EN and ENB inputs respectively of translator circuit 21 disables translator circuit 21 and puts the Q output in a tri-state or high impedance condition. The negative voltage steers current from transistor 33 through transistor 32 thereby removing bias current from transistors 26 and 27 of differential input stage 22. Level shift stage 23 outputs substantially equal voltages at nodes 86 and 87. Transistors 46 and 47 of differential stage 24 are equally enabled thus transistors 59 and 64 are enabled. Current provided by transistor 64 disables transistor 76 of output stage 25. Current provided transistor 59 disables transistors 69 and 73 thereby placing output stage 25 in a tri-state condition.

Translator circuit 21 has two modes of operation when enabled. In either mode of operation translator circuit 21 is enabled by a positive voltage applied across the EN and ENB terminals (for placing translator circuit 21 in a non tri-state condition) and a bias voltage applied to the BIAS input (for generating bias currents). In a first mode of operation, a logic one level ECL signal is applied across the D and DB inputs of translator circuit 21. The logic one level ECL signal corresponds to a positive voltage applied across the D and DB inputs respectively. The logic one level ECL signal increases current through transistor 26 and decreases current through transistor 27 of differential input stage 22. The voltage at node 81 decreases while the voltage at node 82 increases. Thus, a negative differential output voltage is provided by differential input stage 22 across nodes 81 and 82.

In the preferred embodiment, level shift stage 23 level shifts a differential voltage provided by input differential stage 22 by a predetermined DC voltage. The voltage at node 81 is level shifted by the base-emitter junction of transistor 36 and the base-emitter conjunction of transistor 37. Similarly, the voltage at node 82 is level shifted by the base emitter conjunction of transistor 38 and the base emitter junction of transistor 39. Thus, the negative differential voltage provided at nodes 81 and 82 of differential input stage 22 is level shifted a substantially equal amount at nodes 86 and 87 respectively. Transistors 36-38 provide a secondary benefit of buffering the first and second outputs of differential input stage 22 and providing a low impedance output at nodes 86 and 87 for driving differential stage 24. In the preferred embodiment, transistors 41 and 43 of level shift stage 23 provides substantially equal currents for biasing transistors 36 and 37, and transistors 38 and 39 respectively. Noise that is coupled from either the first or second power supplies is coupled substantially equally to nodes 86 and 87 due to the symmetry of the circuits in level shift stage 23.

Differential stage 24 rejects common mode signals such as power supply noise applied to nodes 86 and 87. The negative differential voltage across nodes 86 and 87 is applied across the first and second inputs of differential stage 24 respectively. Current provided by transistor 47 increases while current provided by transistor 46 decreases. The increase in current provided by transistor 47 increases the current provided by transistor 64 thereby decreasing the voltage at node 97. The decrease in current provided by transistor 46 decreases the current output by transistor 59 thereby increasing the voltage at node 93.

The first and second inputs of output stage 25 receive the voltages at nodes 97 and 93 respectively. The decrease in voltage at node 97 begins to turn off transistor 76. Transistors 69 and 73 form a darlington pair that follow the voltage at node 93. In the limit, transistor 69 provides no current, the maximum output voltage provided by output stage 25 at the Q output is the second power supply voltage less the base-emitter junction of transistor 69 and the base-emitter junction voltage of transistor 73. This voltage corresponds to a TTL logic one level at the Q output. Diode 72 prevents transistor 73 from going into hard saturation by removing base drive from transistor 69 when node 102 is approximately the same voltage as node 101. Resistor 71 provides a path for discharging node 101 when transistor 69 is disabled.

The first and second non-saturating output drive stages of differential stage 24 prevent transistors 64 and 59 from saturating and eliminate the need for Schottky diodes. Transistor saturation is characterized by both the base-emitter and base-collector junctions being forward biased. Current gain of a transistor is drastically reduced in saturation and delay in turning off a saturated transistor may be considerable.

Translator circuit 21 employs circuitry to prevent transistors of differential stage 24 and output stage 25 from going into hard saturation without using Schottky diodes. Resistors 61 and 62, and diode 63 prevent transistor 64 from saturating in the first non-saturating output drive stage of differential stage 24. Resistors 61 and 62 generate a voltage greater than the base-emitter junction voltage of transistor 64 at a predetermined current. For example, assume the base-emitter junction voltage of transistor 64 when enabled is approximately 0.7 volts and the base current of transistor 64 is negligible. Assume diode 63 also has a junction voltage of approximately 0.7 volts when enabled. Resistors 61 and 62 are chosen to generate a voltage of 1.0 volt at node 96 when transistor 47 outputs the predetermined current. The voltage drops across resistors 61 and 62 are 0.3 volts and 0.7 volts (base-emitter voltage of transistor 64) respectively at the predetermined current. Diode 63 is enabled when the voltage at node 96 less the collector voltage (node 97) of transistor 64 is approximately 0.7 volts. For example, if node 96 is at 1.0 volt and transistor 64 attempts to go into saturation, diode 63 clamps the voltage at its collector at 0.3 volts and diverts base drive of transistor 64 to the collector of transistor 64 thereby preventing transistor 64 from going into hard saturation. Further increases in current provided by transistor 47 are diverted by diode 63 to the collector of transistor 64 and node 96 remains at approximately 1.0 volt. The base-collector is forward biased in this condition (0.4 volts) but the forward bias is not enough to turn the junction on to any significant extent.

The second non-saturating output drive stage of differential stage 24 operates in analogous fashion as first non-saturating output drive stage described hereinabove. Furthermore, transistor 76 of output stage 25 is prevented from going into hard saturation by resistors 67 and 68 and diode 74 which is configured similarly to the first and second non-saturating output drive stages of differential stage 24. By keeping transistor 76 from going into hard saturation, speed is maintained.

In a second mode of operation, a logic zero level ECL signal is applied across the D and DB inputs of translator circuit 21. The logic zero level ECL signal corresponds to a negative voltage applied across the D and DB inputs respectively. The logic zero level ECL signal decreases current through transistor 26 and increases current through transistor 27 of differential input stage 22. The voltage at node 81 increases while the voltage at node 82 decreases. Thus, a positive differential output voltage is provided by differential input stage 22 across nodes 81 and 82.

Level shift stage 23 level shifts the positive differential voltage provided at nodes 81 and 82 of differential input stage 22 a substantially equal voltage to nodes 86 and 87 respectively.

The positive differential voltage across nodes 86 and 87 is applied across the first and second inputs of differential stage 24 respectively. Current provided by transistor 47 decreases while current provided by transistor 46 increases. The decrease in current provided by transistor 47 decreases the current provided by transistor 64 thereby increasing the voltage at node 97. The increase in current provided by transistor 46 increases the current output by transistor 59 thereby decreasing the voltage at node 93.

The first and second inputs of output stage 25 receive the voltages at nodes 97 and 93 respectively. The decrease in voltage at node 93 disables transistors 69 and 73 of output stage 25. The increase in voltage at node 97 increases current output by transistor 76 thereby pulling the Q output towards ground. The Q output at a voltage of approximately ground corresponds to a TTL logic zero level. Resistors 66, 67, and 68, and diode 74 prevent transistor 76 of output stage 25 from going into hard saturation and determine the minimum voltage at the Q output. Resistors 66, 67, and 68 form a resistor divider for generating predetermined voltages at nodes 99 and 97. Operation of resistors 67–68 and diode 74 is analogous to the operation of the first non-saturating output drive stage described hereinabove.

By now it should be appreciated that a translator circuit has been described that translates an ECL logic level to a TTL logic level. The translator circuit operates at high speeds, rejects power supply noise, and does not use Schottky diodes to prevent transistors from saturating.

Furthermore, a method for translating an ECL signal to a TTL signal has been provided. The ECL signal is received by the translator circuit. The ECL signal is level shifted by a predetermined voltage with a level shift circuit. The level shift circuit is responsive to the ECL signal and provides a level shifted differential signal. The level shifted differential signal is differentially buffered by a differential stage. The differential stage is responsive to the level shifted differential signal and provides a differential signal. An output stage converts the differential signal to a TTL signal corresponding to the ECL signal.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

I claim:

1. A translator circuit for converting an ECL (Emitter Coupled Logic) signal to a TTL (Transistor Transistor Logic) signal, the translator circuit comprising:
    a differential input stage having a D input, a DB input, a first output, and a second output, said D and DB inputs for receiving the ECL signal;
    a level shift stage having a first input and, a second input, a first output, and a second output, said first and second inputs of said level shift stage respectively coupled to said first and second outputs of said differential input stage;
    a differential stage having a first input and a second input, a first output, and a second output, said first and second inputs of said differential stage respectively coupled to said first and second outputs of said level shift stage, said differential stage comprising:
        a first transistor of a first conductivity type having a first electrode, a control electrode, and la second electrode, said control electrode of said first transistor coupled to said first input of said differential stage;
        a second transistor of said first conductivity type having a first electrode, a control electrode, and a second electrode, said control electrode of said second transistor coupled to said second input of said differential stage and said second electrode of said second transistor coupled to said second electrode of said first transistor;
    a first non-saturating output drive stage having a first terminal and a second terminal, said first terminal of said first non-saturating output drive stage coupled to said first electrode of said first transistor and said second terminal of said first non-saturating output drive stage coupled to said first output of said differential stage, said first non-saturating output, said first non-saturating output drive stage comprising:
        a first resistor having a first terminal and a second terminal, said first terminal of said first resistor coupled to said first terminal of said first non-saturating output drive stage;
        a second resistor having a first terminal and a second terminal, said first terminal of said second resistor coupled to said second terminal of said first resistor and said second terminal of said second resistor coupled for receiving a second supply voltage;
        a diode having a first terminal and a second terminal respectively coupled to said first terminal and said second terminal of said first non-saturating output drive stage; and
        a transistor of a second conductivity type having a first electrode, a control electrode, and a second electrode, said first electrode of said transistor coupled to said second terminal of said first non-saturating output drive stage, said control electrode of said transistor coupled to said second terminal of said first resistor, and said second electrode of said transistor coupled for receiving said second supply voltage;
    a second non-saturating output drive stage having a first terminal and a second terminal said first terminal of said second non-saturating output drive stage coupled to said first electrode of said second transistor and said second terminal of said second non-saturating output drive coupled to said second output of said differential stage; and a bias stage having a first terminal and a second terminal, said first terminal of said bias stage coupled to said second electrode of said first transistor and said second terminal of said bias stage coupled to a BIAS input; and an output stage having a first input and a second input, and a Q output, said first and second inputs of said output stage coupled respectively to said first and second outputs of said differential stage and said Q output for providing the TTL signal.

2. The translator circuit as recited in claim 1 wherein said differential input stage comprises:

a first transistor of a second conductivity type having a first electrode, a control electrode, and a second electrode, said first electrode of said first transistor coupled to said first output of said differential input stage and said control electrode of said first transistor coupled to said D input of said differential input stage;

a second transistor of said second conductivity type having a first electrode, a control electrode, and a second electrode, said first electrode of said second transistor coupled to said second output of said differential input stage, said control electrode of said second transistor coupled to said DB input of said differential input stage and said second electrode of said second transistor coupled to said second electrode of said first transistor;

a first resistor having a first terminal and a second terminal, said first terminal of said first resistor coupled to said first output of said differential input stage and said second terminal of said first resistor coupled for receiving a first supply voltage;

a second resistor having a first terminal and a second terminal, said first terminal of said second resistor coupled to said second output of said differential input stage and said second terminal of said second resistor coupled for receiving said first supply voltage; and a current source having a first terminal coupled to said second electrode of said first transistor and a second terminal coupled for receiving a second supply voltage.

3. The translator circuit as recited in claim 2 wherein said differential input stage further includes:

a third transistor of said second conductivity type coupled between said first transistor and said current source having a first electrode, a control electrode, and a second electrode, said first electrode of said third transistor coupled to said second electrode of said first transistor, said control electrode of said third transistor coupled to an EN input, and said second electrode of said third transistor coupled to said first terminal of said current source; and a fourth transistor of said second conductivity type having a first electrode, a control electrode, and a second electrode, said first electrode of said fourth transistor coupled for receiving said first supply voltage, said control electrode of said fourth transistor coupled to an ENB input, and said second electrode of said fourth transistor coupled to said first terminal of said current source.

4. The translator circuit as recited in claim 2 wherein said current source comprises:

a transistor of said second conductivity type having a first electrode, a control electrode, and a second electrode, said first electrode of said transistor coupled to said first terminal of said current source and said control electrode of said transistor coupled to a BIAS input; and a resistor halving a first terminal and a second terminal, said first terminal of said resistor coupled to said second electrode of said transistor and said second terminal of said resistor coupled for receiving said second supply voltage.

5. The translator circuit as recited in claim 1 wherein said level shift stage comprises:

a first transistor of a second conductivity type having a first electrode, a control electrode, and a second electrode, said first electrode of said first transistor coupled for receiving a first supply voltage and said control electrode of said first transistor coupled to said first input of said level shift stage;

a second transistor of said second conductivity type having a first electrode, a control electrode, and a second electrode, said first and control electrodes of said second transistor coupled to said second electrode of said first transistor and said second electrode of said second transistor coupled to said first output of said level shift stage;

a first current source having a first terminal coupled to said first output of said level shift stage and a second terminal coupled for receiving a second supply voltage;

a third transistor of said second conductivity type having a first electrode, a control electrode, and a second electrode, said first electrode of said third transistor coupled for receiving said first supply voltage and said control electrode of said third transistor coupled to said second input of said level shift stage;

a fourth transistor of said second conductivity type having a first electrode, a control electrode, and a second electrode, said first and control electrodes of said fourth transistor coupled to said second electrode of said third transistor and said second electrode coupled to said second output of said level shift stage; and a second current source having a first terminal coupled to said second output of said level shift stage and a second terminal coupled for receiving said second supply voltage.

6. The translator circuit as recited in claim 5 wherein said first and second current sources each comprise:

a transistor of said second conductivity type having a first electrode, a control electrode, and a second electrode, said first electrode of said transistor coupled to said first terminal of said first or second current source and said control electrode of said transistor coupled to a BIAS input; and a resistor having a first terminal and a second terminal, said first terminal of said resistor coupled to said second electrode of said transistor and said second terminal of said resistor coupled for receiving said second supply voltage.

7. The translator circuit as recited in claim 1 wherein said second non-saturating output drive stage of said differential stage comprises:

a first resistor having a first terminal and a second terminal, said first terminal of said first resistor coupled to said first terminal of said second non-saturating output drive stage;

a second resistor having a first terminal and a second terminal, said first terminal of said second resistor coupled to said second terminal of said first resistor and said second terminal of said second resistor coupled for receiving a second supply voltage;

a third resistor having a first terminal and a second terminal, said first terminal of said third resistor coupled to said second terminal of said second non-saturating output drive stage and said second terminal of said third resistor coupled for receiving a first supply voltage;

a diode having a first terminal and a second terminal respectively coupled to said first terminal and said second terminal of said second non-saturating output drive stage; and a transistor of a second conductivity type having a first electrode, a control electrode, and a second electrode, said first electrode of said transistor coupled to said second terminal of said second non-saturating output drive stage, said control electrode of said transistor coupled to said second terminal of said first resistor, and said second electrode of said transistor coupled for receiving said second supply voltage.

8. The translator circuit as recited in claim 1 wherein said bias stage of said differential stage comprises:

a first transistor of a second conductivity type having a first electrode, a control electrode, and a second electrode, said control electrode of said first transistor coupled to said second terminal of said bias stage;

a first resistor having a first terminal and a second terminal, said first terminal of said first resistor coupled to said second electrode of said first transistor and said second terminal of said first resistor coupled for receiving a second supply voltage;

a second transistor of said first conductivity type having a first electrode, a control electrode, and a second electrode, said first electrode of said second transistor coupled for receiving said second supply voltage and said control electrode of said second transistor coupled to said first electrode of said first transistor;

a third, transistor of said first conductivity type having a first electrode, a control electrode, and a second electrode, said first electrode of said third transistor coupled to said first electrode of said first transistor and said control electrode of said third transistor coupled to said second electrode of said second transistor;

a second resistor having a first terminal and a second terminal, said first terminal of said second resistor coupled to said second electrode of said third transistor and said second terminal of said second resistor coupled for receiving a first supply voltage;

a fourth transistor of said first conductivity type having a first electrode, a control electrode, and a second electrode, said first electrode of said fourth transistor coupled to said first terminal of said bias stage and said control electrode of said fourth transistor coupled to said second electrode of said second transistor; and a third resistor having a first terminal and a second terminal, said first terminal of said third resistor coupled to said second electrode of said fourth transistor and said second terminal of said third resistor coupled for receiving said first supply voltage.

9. The translator circuit as recited in claim 1 wherein said output stage comprises:

a first transistor having a first electrode, a control electrode, and a second electrode, said first electrode of said first transistor coupled for receiving a first supply voltage and said control electrode of said first transistor coupled to said second input of said output stage;

a second transistor having a first electrode, a control electrode, and a second electrode, said control electrode of said second transistor coupled to said second electrode of said first transistor and said second electrode of said second transistor coupled to said Q output of said output stage;

a first resistor having a first terminal and a second terminal, said first terminal of said first resistor coupled to said first electrode of said second transistor and said second terminal of said first resistor coupled for receiving a first supply voltage;

a second resistor having a first terminal and a second terminal, said first terminal of said second resistor coupled to said control electrode of said second transistor and said second terminal of said second resistor coupled to said Q output of said output stage; and a third transistor having a first electrode, a control electrode, and a second electrode, said first electrode of said third transistor coupled to said Q output of said output stage, said control electrode of said third transistor coupled to said first input of said output stage, and said second electrode of said third transistor coupled for receiving a second supply voltage.

10. The translator circuit as recited in claim 9 wherein said output stage further includes:

a first diode having a first terminal and a second terminal, said first terminal of said first diode coupled to second input of said output stage and said second terminal of said first diode coupled to said first electrode of said second transistor;

a third resistor having a first terminal and a second terminal, said first terminal of said third resistor coupled for receiving said first supply voltage;

a fourth resistor having a first terminal and a second terminal, said first terminal of said fourth resistor coupled to said second terminal of said third resistor and said second terminal of said fourth resistor coupled to said first input of said output stage;

a fifth resistor having a first terminal and a second terminal, said first terminal of said fifth resistor coupled to said first input of said output stage and said second terminal of aid fifth resistor coupled for receiving said second supply voltage; and a second diode having a first terminal and a second terminal, said first terminal of said second diode coupled to said second terminal of said third resistor and said second terminal of said second diode coupled to said Q output of said output stage.

11. A translator circuit for converting an ECL (Emitter Coupled Logic) signal to a TTL (Transistor Transistor Logic) signal, the translator circuit comprising:

a differential input stage having a D input, a DB input, a first output, and a second output, said D and DB inputs for receiving the ECL signal and for providing a differential output signal;

a level shift stage having a first input, a second input, a first output, and a second output, said first and second inputs of said level shift stage respectively coupled to said first and second outputs of said differential input stage and said level shift stage for level shifting said differential output signal of said differential input stage predetermined voltage;

a differential stage having a first input, a second input, a first output, and a second output, said first and second inputs of said differential stage respectively coupled to said first and second outputs of said level shift stage and said differential inputs stage comprising:

- a first transistor of a first conductivity type having a first electrode, a control electrode, and a second electrode, said control electrode of said first transistor coupled to said first input of said differential stage;
- a second transistor of said first conductivity type having a first electrode, control electrode, and a second electrode, said control electrode of said second transistor coupled to said second input of said differential stage and said second electrode of said second transistor coupled to said second electrode of said first transistor;
- a first non-saturating output drive stage having a first terminal and second terminal, said first terminal of said first non-saturating output drive stage coupled to said first electrode of said first transistor and said second terminal of said first non-saturating output drive stage coupled to said first output of said differential stage:
- a second non-saturating output drive stage having a first terminal a and a second terminal, said first terminal of said second non-saturating output drive stage coupled to said first electrode of said second transistor and said second terminal of said second non-saturating output drive stage coupled to said second output of said differential stage; and
- a bias stage having a first terminal and a second terminal, said first terminal of said bias stage coupled to said second electrode of said first transistor and said second terminal of said bias stage coupled to a BIAS input, said bias stage comprising:
  - a first transistor of a second conductivity type having a first electrode, a control electrode, and a second electrode, said control electrode of said first transistor coupled to said second terminal of said bias stage;
  - a first resistor having a first terminal and a second terminal, said first terminal of said first resistor coupled to said second electrode of said first transistor and said second terminal of said first resistor coupled for receiving a second supply voltage;
  - a second transistor of said first conductivity type having a first electrode, a control electrode, and a second electrode, said first electrode of said second transistor coupled for receiving said second supply voltage and said control electrode of said second transistor coupled to said first electrode of said first transistor;
  - a third transistor of said first conductivity type having a first electrode, a control electrode, and a second electrode, said first electrode of said third transistor coupled to said first electrode of said first transistor and said control electrode of said third transistor coupled to said second electrode of said second transistor;
  - a second resistor having a first terminal and a second terminal, said first terminal of said second resistor coupled to said second electrode of said third transistor and said second terminal of said second resistor coupled for receiving a first supply voltage;
  - a fourth transistor of said first conductivity type having a first electrode, a control electrode, and a second electrode, said first electrode of said fourth transistor coupled to said first terminal of said bias stage and said control electrode of said fourth transistor coupled to said second electrode of said second transistor; and
  - a third resistor having a first terminal and a second terminal, said first terminal of said third resistor coupled to said second electrode of said fourth transistor and said second terminal of said third resistor coupled for receiving said first supply voltage; and an output stage having a first input, a second input, and a Q output, said first and second inputs of said output respectively coupled to said first and second outputs of said differential stage and said Q output of said output stage for providing the TTL signal.

12. The translator circuit as recited in claim 11 wherein said first non-saturating output drive stage comprises:

- a first resistor having a first terminal and a second terminal, said first terminal of said first resistor coupled to said first terminal of said first nonsaturating output drive stage;
- a second resistor having a first terminal and a second terminal, said first terminal of said second resistor coupled to said second terminal of said first resistor and said second terminal of said second resistor coupled for receiving a second supply voltage;
- a diode having a first terminal and a second terminal respectively coupled to said first terminal and said second terminal of said first non-saturating output drive stage; and
- a transistor of a second conductivity type having a first electrode, a control electrode, and a second electrode, said first electrode of said transistor coupled to said second terminal of said first non-saturating output drive stage, said control electrode of said transistor coupled to said second terminal of said first resistor, and said second electrode of said transistor coupled for receiving said second supply voltage.

13. The translator circuit as recited in claim 11 wherein said second non-saturating output drive stage comprises:

- a first resistor having a first terminal and a second terminal, said first terminal of said first resistor coupled to said first terminal of said second non-saturating output drive stage;
- a second resistor having a first terminal and a second terminal, said first terminal of said second resistor coupled to said second terminal of said first resistor and said second terminal of said second resistor coupled for receiving a second supply voltage;
- a third resistor having a first terminal and a second terminal said first terminal of said third resistor coupled to said second terminal of said second non-saturating output drive stage and said second terminal of said third resistor coupled for receiving a first supply voltage;

a diode having a first terminal and a second terminal respectively coupled to said first terminal and said second terminal of said second non-saturating output drive stage; and a transistor of a second conductivity type having a first electrode, a control electrode, and a second electrode, said first electrode of said transistor coupled to said second terminal of said second non-saturating output drive stage, said control electrode of said transistor coupled to said second terminal of said first resistor, and said second electrode of said transistor coupled for receiving said second supply voltage.

14. The translator circuit as recited in claim 11 wherein said output stage comprises:

a first transistor having a first electrode, a control electrode, and a second electrode, said first electrode of said first transistor coupled for receiving a first supply voltage and said control electrode of said first transistor coupled to said second input of said output stage;

a second transistor having a first electrode, a control electrode, and a second electrode, said control electrode of said second transistor coupled to said second electrode of said first transistor and said second electrode of said second transistor coupled to said Q output of said output stage;

a first resistor having a first terminal and a second terminal, said first terminal of said first resistor coupled to said first electrode of said second transistor and said second terminal of said first resistor coupled for receiving a first supply voltage;

a second resistor having a first terminal and a second terminal, said first terminal of said second resistor coupled to said control electrode of said second transistor and said second terminal of said second resistor coupled to said Q output of said output stage; and a third transistor having a first electrode, a control electrode, and a second electrode, said first electrode of said third transistor coupled to said Q output of said output stage, said control electrode of said third transistor coupled to said first input of said output stage, and said second electrode of said third transistor coupled for receiving a second supply voltage.

15. The translator circuit as recited in claim 14 wherein said output stage further includes:

a first diode having a first terminal and a second terminal, said first terminal of said first diode coupled to second input of said output stage and said second terminal of said first diode coupled to said first electrode of said second transistor;

a third resistor having a first terminal and a second terminal, said first terminal of said third resistor coupled for receiving said first supply voltage;

a fourth resistor having a first terminal and a second terminal, said first terminal of said fourth resistor coupled to said second terminal of said third resistor and said second terminal of said fourth resistor coupled to said first input of said output stage;

a fifth resistor having a first terminal and a second terminal, said first terminal of said fifth resistor coupled to said first input of said output stage and said second terminal of said fifth resistor coupled for receiving said second supply voltage; and a second diode having a first terminal and a second terminal, said first terminal of said second diode coupled to said second terminal of said third resistor and said second terminal of said second diode coupled to said Q output of said output stage.

* * * * *

UNITED STATES PATENT AND TRADEMARK OFFICE
CERTIFICATE OF CORRECTION

PATENT NO. : 5,432,466
DATED : July 11, 1995
INVENTOR(S) : Phuc C. Pham

It is certified that error appears in the above-indentified patent and that said Letters Patent is hereby corrected as shown below:

In column 8, line 19, claim 1, delete "1a" and insert therefor --a--.

In column 12, line 52, claim 10, delete "aid" and insert therefor --said--.

In column 13, line 17, claim 11, after "electrode," insert --a--.

In column 14, line 22, claim 11, after "output" insert --stage--.

Signed and Sealed this

Nineteenth Day of December, 1995

Attest:

BRUCE LEHMAN

Attesting Officer

Commissioner of Patents and Trademarks